(12) United States Patent
Yang et al.

(10) Patent No.: US 11,496,847 B1
(45) Date of Patent: Nov. 8, 2022

(54) STATE DETECTION DEVICE FOR USE IN AN AUDIO INTERFACE

(71) Applicant: Realtek Semiconductor Corp., HsinChu (TW)

(72) Inventors: Quan-Xi Yang, HsinChu (TW); Cheng-Pin Chang, HsinChu (TW); Chih-Kang Chien, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/510,409

(22) Filed: Oct. 26, 2021

(30) Foreign Application Priority Data

May 27, 2021 (TW) .................................. 110119218

(51) Int. Cl.
| | |
|---|---|
| *H04R 29/00* | (2006.01) |
| *H04R 3/00* | (2006.01) |
| *H04R 5/04* | (2006.01) |
| *H01R 13/66* | (2006.01) |
| *G01R 31/68* | (2020.01) |
| *G06F 3/16* | (2006.01) |

(52) U.S. Cl.
CPC ............ *H04R 29/00* (2013.01); *G01R 31/68* (2020.01); *G06F 3/162* (2013.01); *H01R 13/6683* (2013.01); *H04R 3/00* (2013.01); *H04R 5/04* (2013.01); *H04R 2420/05* (2013.01)

(58) Field of Classification Search
CPC ..... G01R 31/68; G06F 3/162; H01R 13/6683; H04R 29/00; H04R 3/00; H04R 5/04; H04R 5/033; H04R 1/10; H04R 2420/05

USPC ........................... 381/58, 74, 384; 455/575.2
See application file for complete search history.

(56) References Cited

U.S. PATENT DOCUMENTS

| | | | |
|---|---|---|---|
| 7,161,491 B2 * | 1/2007 | Garcia ................. | H04B 1/3833 340/604 |
| 9,479,863 B2 * | 10/2016 | Chien ...................... | H04R 3/00 |
| 9,571,916 B2 * | 2/2017 | Hsu ....................... | H04R 1/1041 |
| 9,609,447 B2 | 3/2017 | Miske | |
| 9,794,708 B2 * | 10/2017 | Turner ................... | H04R 29/00 |
| 10,451,659 B2 * | 10/2019 | Chang .................. | H04R 1/1041 |

(Continued)

FOREIGN PATENT DOCUMENTS

| | | |
|---|---|---|
| CN | 105101009 B | 4/2019 |
| JP | 2014-107757 A | 6/2014 |

(Continued)

*Primary Examiner* — Xu Mei
(74) *Attorney, Agent, or Firm* — Winston Hsu

(57) ABSTRACT

A state detection device in an audio interface includes: a first voltage detection circuit, a second voltage detection circuit and a state determination circuit. The first voltage detection circuit is coupled to a first contact and a second contact of an audio jack socket, for detecting a voltage across the first contact and the second contact to generate a first detection value. The second voltage detection circuit is coupled to a third contact of the audio jack socket, for detecting a voltage on the third contact to generate a second detection value. The state determination circuit is coupled to the first voltage detection circuit and the second voltage detection circuit, for determining a water ingress state of the audio jack socket according to the first detection value, and a connector type of an audio plug that is inserted into the audio jack socket according to the second detection value.

14 Claims, 6 Drawing Sheets

(56) References Cited

U.S. PATENT DOCUMENTS

| | | | |
|---|---|---|---|
| 10,531,214 B2* | 1/2020 | Chun | H04R 3/00 |
| 11,133,623 B2* | 9/2021 | Tyrrell | H01R 13/70 |
| 2008/0130911 A1* | 6/2008 | Tsen | H04R 5/04 |
| | | | 381/74 |
| 2017/0272877 A1 | 9/2017 | Roh | |
| 2019/0302047 A1* | 10/2019 | Park | G01N 27/045 |

FOREIGN PATENT DOCUMENTS

| | | |
|---|---|---|
| KR | 10-2008-0032714 A | 4/2008 |
| KR | 10-2017-0108803 A | 9/2017 |
| KR | 10-2020-0143985 A | 12/2020 |
| TW | I641270 B | 11/2018 |

* cited by examiner

| | Impedance between 311 and 315 | DET1 | Impedance of 315 relative to ground | DET2 |
|---|---|---|---|---|
| Two-ring Three-pole (Headphones) | 0~1.1K | 0~0.038V | 0~1.1K | 0~1.578V |
| Three-ring Four-pole (Headsets) | 0~1.1K | 0~0.038V | 1.35K~33K | 1.747~3.184V |
| Ingress of water | 2K~2M | 0.068~3.15V | 1.5K~0.7M | N/A |
| Extension Cable | 0~1.1K | 0~0.038V | >2M | 3.3V |

FIG. 3

STATE DETECTION DEVICE FOR USE IN AN AUDIO INTERFACE

BACKGROUND OF THE INVENTION

1. Field of the Invention

The present invention relates to audio interface, and more particularly, to a state detection device for detecting a connector type of audio equipment and a water ingress state of an audio jack socket in an audio interface.

2. Description of the Prior Art

Many electronic devices are connectable to external audio equipment. For example, mobile phones, tablet computers, notebook computers, can be connected to audio equipment, such as earphones/headphones, speakers, and headsets. Such audio equipment and electronic devices are usually connected via connector elements such as audio plugs and audio jack sockets. For example, many headphones have a 3.5 mm audio plug, which can be used to connect to a 3.5 mm audio jack socket provided by an electronic device.

Typically, electronic devices usually rely on some detection mechanisms to detect whether the audio plug has been inserted into the audio jack socket. Accordingly, the electronic device can perform some corresponding operations, such as interrupting or starting audio playback, switching audio playback from built-in speakers to external audio equipment, or avoiding popping sound caused by plugging and unplugging the audio plug. On the other hand, when water enters the audio jack socket, there may be conduction between contacts of the audio jack socket, which will further cause the electronic device to misjudge the insertion of the audio plug. As a result, the electronic devices will fail to properly control audio playback as the audio plug is plugged in or unplugged, or switch between the built-in speaker and the external audio equipment.

On the other hand, 3.5 mm audio plugs are usually two-ring three-pole type (TRS type) or three-ring four-pole type (TRRS type). The two-ring three-pole type 3.5 mm audio plug can be used to transmit stereo analog audio signals, while the three-ring four-pole type 3.5 mm audio plug cannot only transmit stereo analog audio signals, but also transmit a mono microphone signal. In addition, the three-ring four-pole type 3.5 mm audio jack comprises a CTIA type and an OMTP type depending on definition of its poles. Since these different types of 3.5 mm audio plugs are quite common, electronic devices also need to correctly identify the specific connector type, so as to correctly control the external audio equipment and identify signals on each pole of the audio plugs.

SUMMARY OF THE INVENTION

In view of this, the present invention provides a state detection circuit for use in an audio interface to detect a connector type of audio equipment and a water ingress state of an audio jack socket in an audio interface. In embodiments of the present invention, by detecting a voltage cross two contacts of the audio jack socket that are connected to a first pole of an audio plug, it is determined whether ingress of water occurs in the audio jack socket. If it is determined that the ingress of water fails to occur, it is determined that the conductor entering the audio jack socket is the audio plug. Accordingly, embodiments of the present invention determine a connector type of the audio plug and a type of the audio equipment to which the audio plug belongs by detecting a voltage on a contact of the audio jack socket that is connected to a fourth pole of the audio plug. Since the present invention requires no extra contacts for state detection, it is suitable for existing audio jack sockets, and can also provide the ability of identifying different types of audio plugs and detecting the water ingress state of the audio jack socket.

According to one embodiment, a state detection device for use in an audio interface is provided. The state detection device comprises: a first voltage detection circuit, a second voltage detection circuit and a state determination circuit. The first voltage detection circuit is coupled to a first contact and a second contact of an audio jack socket, and configured to detect a voltage across the first contact and the second contact to generate a first detection value. The second voltage detection circuit is coupled to a third contact of the audio jack socket, and configured to detect a voltage on the third contact to generate a second detection value. The state determination circuit is coupled to the first voltage detection circuit and the second voltage detection circuit, configured to determine a water ingress state of the audio jack socket according to the first detection value, and determine a connector type of an audio plug that is inserted into the audio jack socket according to the second detection value.

According to one embodiment, a state detection method for use in an audio interface is provided. The state detection method comprises: detecting a voltage across a first contact and a second contact of an audio jack socket to generate a first detection value; detecting a voltage on a third contact of the audio jack socket to generate a second detection value; and determining a water ingress state of the audio jack socket according to the first detection value, and determining a connector type of an audio plug that is inserted into the audio jack socket according to the second detection value.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 illustrates a scenario that a first detection value and a second detection value change with the water ingress state and different types of audio jacks according to one embodiment of the present invention.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

Reference throughout this specification to "one embodiment" or "an embodiment" means that a particular feature, structure or characteristic described in connection with the embodiment or example is included in at least one embodiment of the present embodiments. Thus, appearances of the phrases "in one embodiment" or "in an embodiment" in various places throughout this specification are not necessarily all referring to the same embodiment. Furthermore, the particular features, structures or characteristics may be combined in any suitable combinations and/or sub-combinations in one or more embodiments.

Figure 1A:
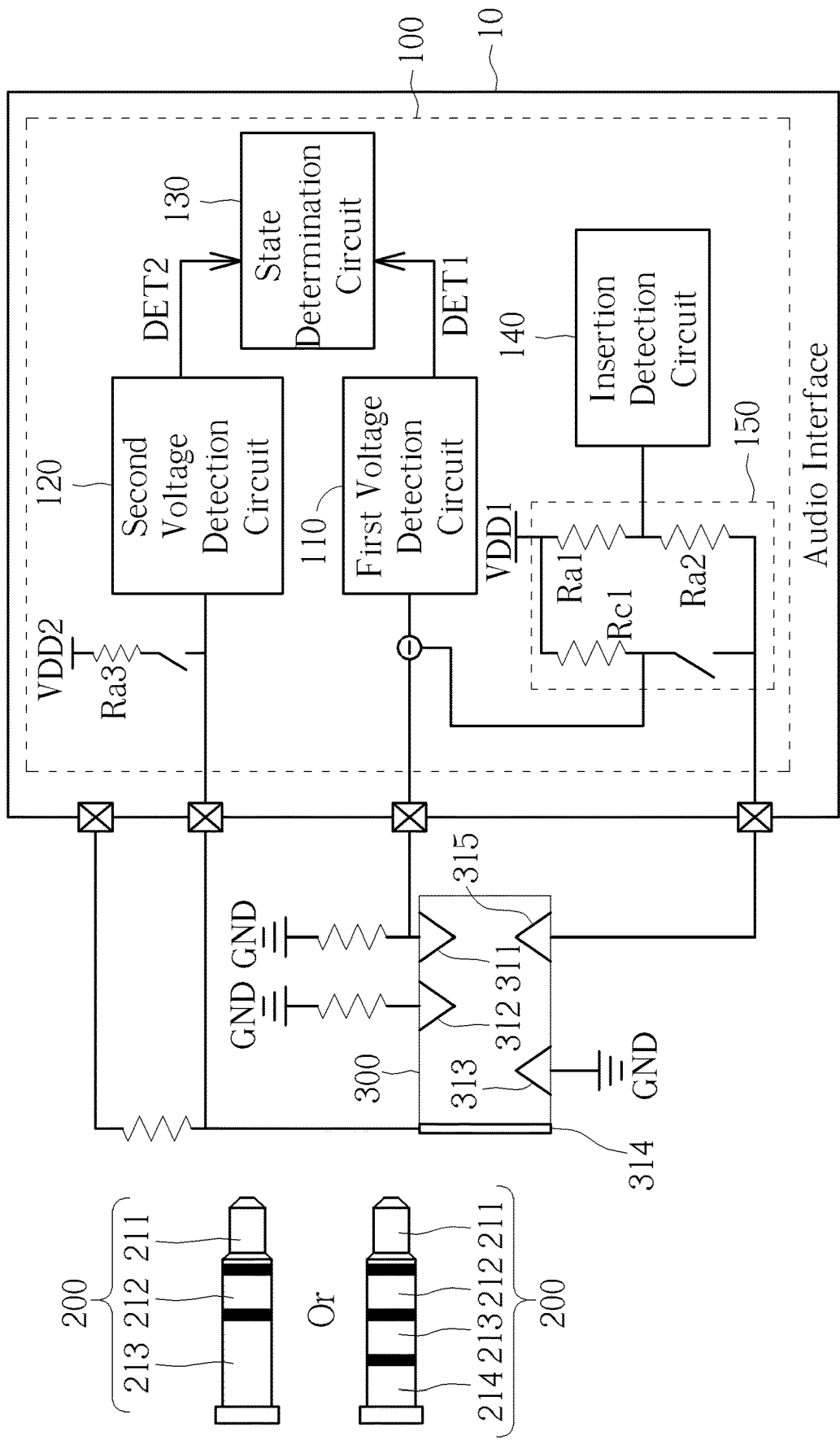
FIG. 1A is a schematic diagram of a state detection circuit and its application according to one embodiment of the present invention.
Figure 1B:
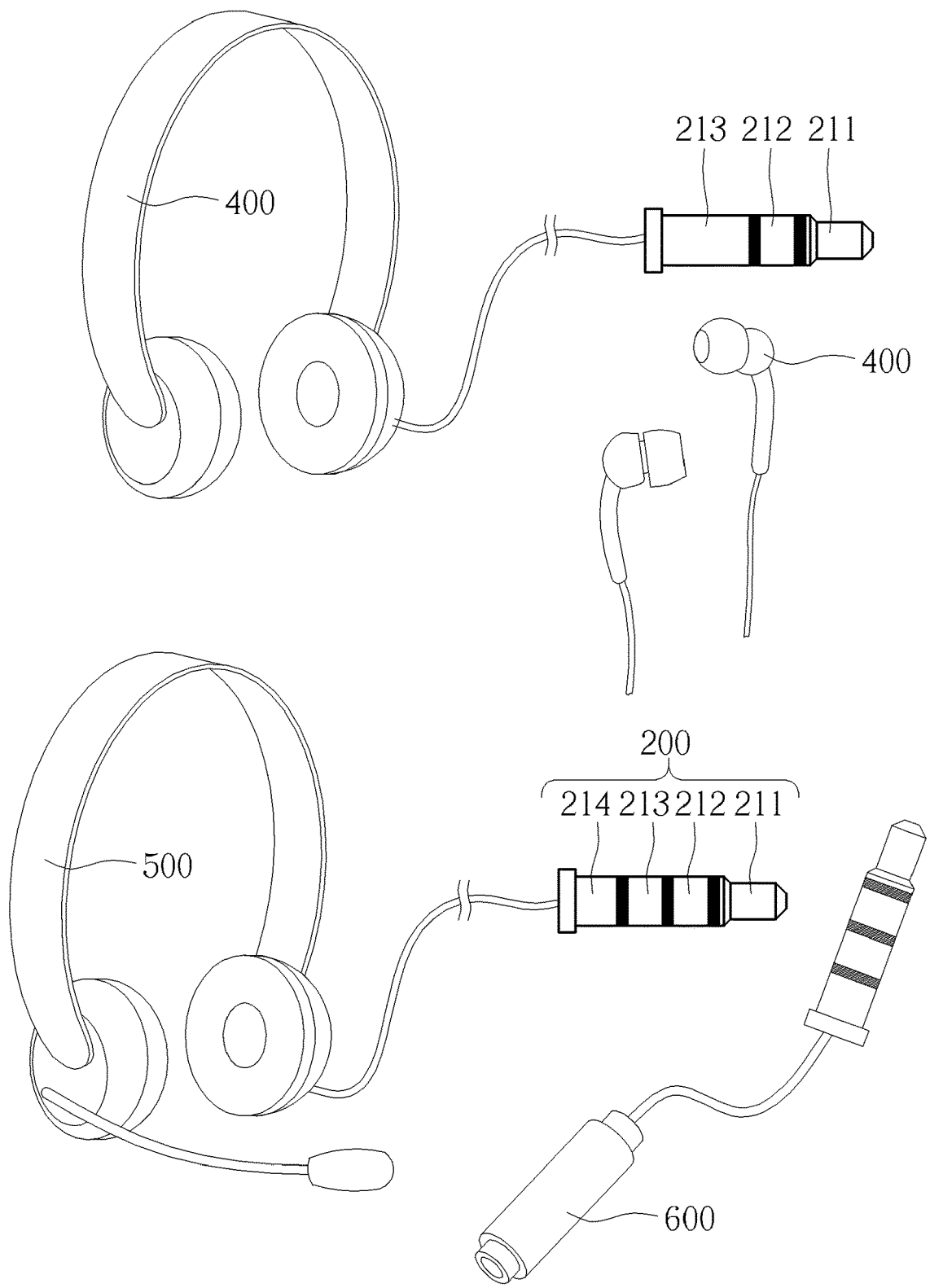
FIG. 1B illustrates different types of audio plugs and related audio equipment that can be identified by embodiments of the present invention.

FIG. 1A shows a schematic diagram of a state detection device 100 and its application according to one embodiment of the present invention. The state detection device 100 of the present invention may be used in an audio interface 10 to detect whether an audio plug 200 (i.e., a male connector) is inserted into the audio jack socket (i.e., a female connector) 300, a type of the audio plug 200, and whether the audio jack socket 300 has ingress of water. The audio interface 10 may be a sound card or a sound processing system of an electronic device (such as a mobile phone, a personal computer, a tablet computer, a notebook computer, a multimedia player, and so on), where the audio interface 10 may also include (not shown) power amplifiers, digital/analog converters, digital audio processors, and so on. The audio plug 200 may be a two-ring three-pole type (such as, a TRS type) connector, which includes a first pole 211, a second pole 212, and a third pole 213. Alternatively, the audio plug 200 may be a three-ring four-pole type (such as, TRRS type) connector, which includes a first pole 211, a second pole 212, a third pole 213 and a fourth pole 214. As shown in FIG. 1B, the audio plug 200 belongs to a part of audio equipment. For example, the two-ring three-pole audio plug 200 can be connected to headphones/earphones (as shown in the figure), speakers and other loudspeaker device 400 through a wire. The three-ring four-pole audio plug 200 can be connected to a sound picking-up and loudspeaker combination device 500 that integrates headphones/earphones and microphones. Moreover, the audio plug 200 may be a three-ring four-pole male connector of an audio extension cable 600. Generally speaking, when the audio plug 200 is the two-ring three-pole type, the first pole 211 is used to receive a left-channel audio signal generated by the audio interface 10 and transmit it to the loudspeaker device 400, the second pole 211 is used to receive a right-channel audio signal generated by the audio interface 10 and transmit it to the loudspeaker device 400, and the third pole 213 is a ground terminal. When the audio plug 200 is the three-ring four-pole type, the first pole 211 is used to receive the left-channel audio signal generated by the audio interface 10 and transmit it to a loudspeaker part of the sound picking-up and loudspeaker combination device 500, and the second pole 212 is used to receive the right-channel audio signal generated by the audio interface 100, and transmit it to the loudspeaker part of the sound picking-up and loudspeaker combination device 500. One of the third pole 213 and the fourth pole 214 is the ground terminal, and the other is used to transmit a microphone signal generated by a sound picking-up part of the sound picking-up and loudspeaker combination device 500 to the audio interface 10.

Please refer to FIG. 1A again. The state detection device 100 of the present invention is coupled to a plurality of conductive contacts in the audio jack socket 300. These conductive contacts include at least a contact 311, a contact 312, a contact 313, a contact 314 and contact 315. If the audio plug 200 is the two-ring three-pole type connector, the contact 311 in the audio jack socket 300 (at an innermost part of an upper end of the audio jack socket 300) is connected to the first pole 211 of the audio plug 200, which is used to transmit the left-channel audio signal. The contact 312 (at an outer part of the upper end of the audio jack socket 300) is connected to the second pole 212 of the audio plug 200, which is used to transmit the right-channel audio signal. The contact point 313 (at an outer part of a lower end of the audio jack socket 300 but deviated from the position of the contact 312) is connected to the third pole 213 of the audio plug 200, and is further coupled to a ground terminal GND. The contact 314 (the outermost ring of the audio jack socket 300) is also connected to the third pole 213 of the audio plug 200. In addition, when the audio plug 200 is the three-ring four-pole type connector, in addition to the contacts 311-313 of the audio jack socket 300 are connected to the first to third poles 211-213 of the audio plug 200, the contact 314 of the audio jack socket 300 is connected to the fourth pole 214 of the audio plug 200 for transmitting the microphone signal. Furthermore, the contact 315 of the audio jack socket 300 (at an innermost part of the lower end of the audio jack socket 300, corresponding to the position of the contact point 311) is connected to the first pole 211 of the audio plug 200.

The state detection device 100 includes a first voltage detection circuit 110, a second voltage detection circuit 120, and a state determination circuit 130. In one embodiment, the first voltage detection circuit 110 and the second voltage detection circuit 120 may be analog-to-digital converters, respectively. The first voltage detection circuit 110 is coupled to the contact 311 of the audio jack socket 300 and is coupled to the contact 315 through a voltage divider 150. When the audio plug 200 is inserted and connected to the audio jack socket 300, the first voltage detection circuit 110 can be coupled to the first pole 211 of the audio plug 200. The second voltage detection circuit 120 is coupled to the contact 314 of the audio jack socket 300, and an input terminal of the second voltage detection circuit 120 is selectively connected to a voltage VDD2 through a pull-up resistor Ra3. Moreover, when the audio plug 200 is inserted and connected to the audio jack socket 300, the second voltage detection circuit 120 can be coupled to the third pole 213 of the audio plug 200 (if the audio plug 200 is the two-ring three-pole type) or the fourth pole 214 (if the audio plug 200 is the three-ring four-pole type).

Figure 2A:
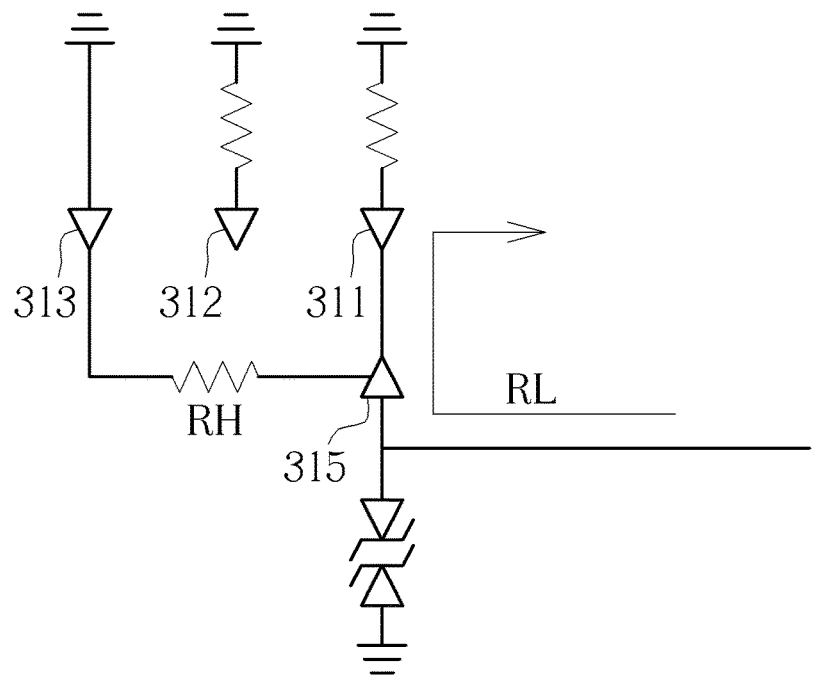
FIGS. 2A and 2B illustrates an approach to detect a water ingress state.
Figure 2B:
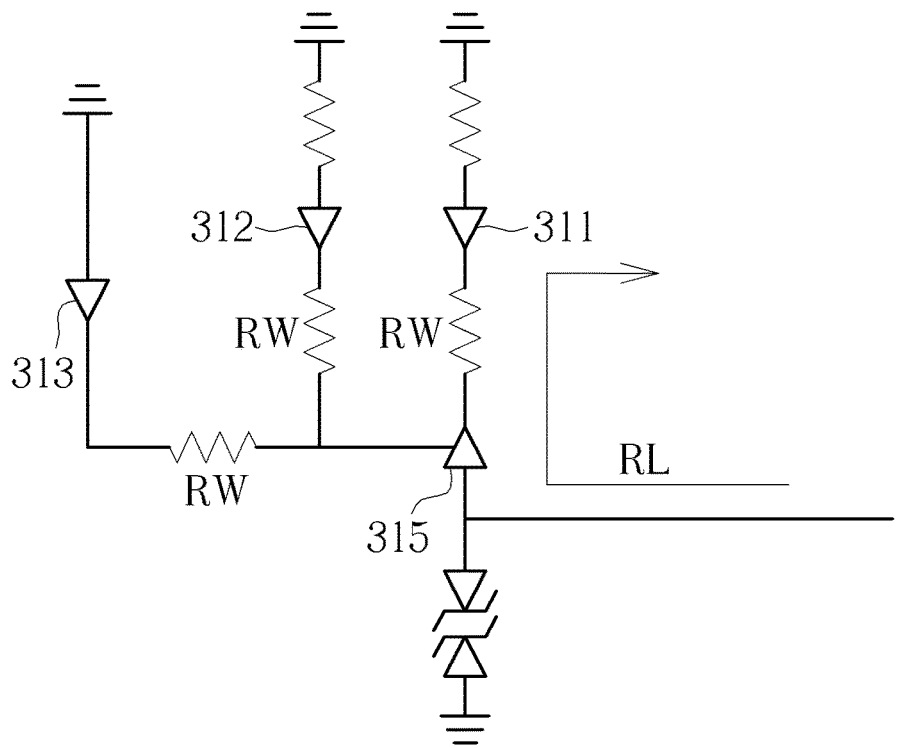

Please refer to FIG. 1A in conjunction with FIG. 2A. When the audio plug 200 is inserted into the audio jack socket 300, an impedance RL between the contact 311 and the contact 315 is approximately equal to an impedance at the first pole 211 of the audio plug 200, such as, an impedance of the loudspeaker device 400 or the sound picking-up and loudspeaker combination device 500, or an impedance of a first pole 211 of the audio extension cable 600, which usually falls within a range of 0-1.1K ohms. As shown in FIG. 2B, once ingress of water occurs in the audio jack socket 300 and water fills the hollow space of the audio jack socket 300, the impedance RL between the contact 311 and the contact 315 will become water impedance RW. As the impedance of salt water is different from that of fresh water (the impedance of the salt water will vary with time), the impedance RW will fall in a range of 2K-2 M ohms. Voltage values on the contact 311 and the contact 315 that are sampled by the first voltage detection circuit 110 will also vary accordingly. Therefore, the state determination circuit 130 in the state detection device 100 can determine whether ingress of water occurs in the audio jack socket 300 according a first detection value DET1 output by the first voltage detection circuit 110. As shown in FIG. 3, assuming that voltage VDD1=3.3V, voltage VDD2=3.3V, resistor Ra3=1.2K ohms, resistor Rc1=100K ohms of the voltage divider 150 and the resistor Ra1=1 M Ohm and the resistor Ra2=850K ohms, various states and different types of audio plugs 200 will cause the first detection value DET1 sampled by the first voltage detection circuit 110 and the second detection value DET2 sampled by the second voltage detection circuit 120 to change. As can be seen from the table, the first detection value DET1 is significantly increased when ingress of water occurs in the audio jack socket 300 (for example, 0.068-3.15V). Therefore, the state determination circuit 130 may be provided with a first predetermined threshold TH1 (for example, but not limited to a value between 0.038V and 0.068V). When the first detection value DET1 sampled by the first voltage detection circuit 110 is higher than the first predetermined threshold TH1, it is determined that ingress of water currently occurs in the audio jack socket 300. When the first detection value DET1 is lower than the first predetermined threshold TH1, it is determined that no ingress of water occurs in the audio jack socket 300, and the conductor entering the audio jack socket 300 may be the audio plug 200. In one embodiment, only when the first detection value DET1 is lower than the first predetermined threshold TH1, the second voltage detection circuit 120 will be activated to determine a connector type of the audio plug 200.

Figure 4:
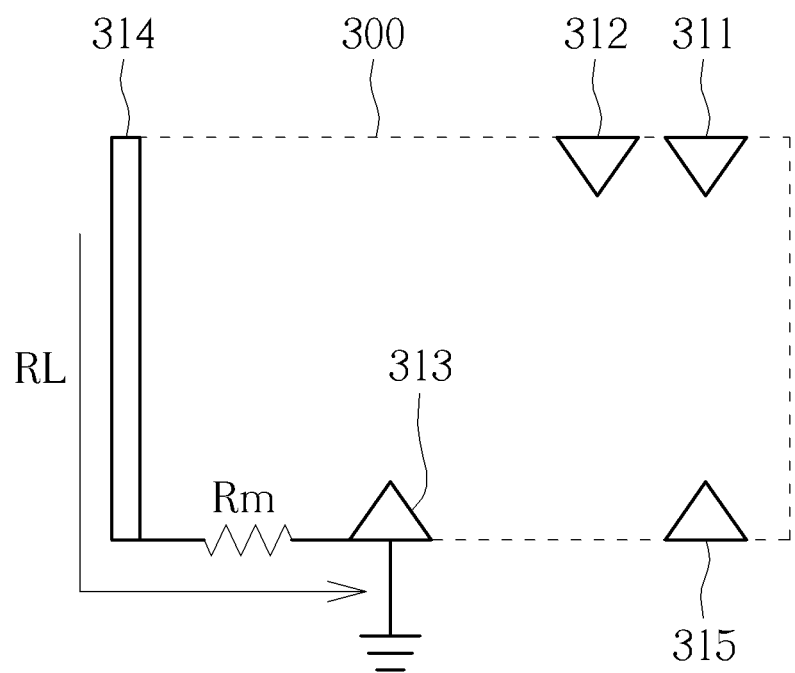
FIG. 4 illustrates an approach to detect the water ingress state.

Furthermore, as shown by FIG. 4, if the audio plug 200 is the two-ring three-pole male connector belonging to the cable of the loudspeaker device 400, once it is inserted into the audio jack socket 300, the contact 313 and the contact 314 will be shorted (i.e., both connected to the third pole 213 of the audio plug 200), and the impedance RL between these two contacts is extremely low. Considering the existence of contact impedance, the impedance RL is approximately between 0 and 1.1K ohms. On the other hand, if the audio plug 200 is the three-ring four-pole male connector belonging to a cable of the sound picking-up and loudspeaker combination device 500, the impedance RL between the contact 313 and the contact 314 (which are respectively connected to the third pole 213 and the four pole 214 of the audio plug 200) is approximately equal to the impedance Rm of the sound picking-up part in the sound picking-up and loudspeaker combination device 500, which falls between 1.35 to 33K ohms. Moreover, if the audio plug 200 is the three-ring four-pole male connector of an audio extension cable 600, and an audio jack socket at the other end of the audio extension cable 600 is not connected to a conductor, the impedance RL between contact 313 and the contact 314 (which are respectively connected to the third pole 213 and the fourth pole 214 of the audio plug 200) is infinite.

Furthermore, as can be understood by table in FIG. 3, the second detection value DET2 on the contact 314 sampled by the second voltage detection circuit 120 has three types of value distributions. If the audio plug 200 is the two-ring three-pole type, the second detection value DET2 has the smallest value (e.g., 0-1.578V). If the audio plug 200 is the three-ring four-pole type, the second detection value DET2 has the intermediate value (e.g., 1.747V-3.184V). If the audio plug 200 is the three-ring four-pole male connector of the audio extension cable, the second detection value DET2 has the largest value (e.g., 3.3V). Therefore, the state determination circuit 130 can preset two thresholds TH2 (for example, but not limited to a value between 3.184-3.3V) and TH3 (for example, but not limited to a value between 1.578-1.747V). When the second detection value DET2 sampled by the second voltage detection circuit 120 is higher than the threshold TH2, it is determined that the audio plug 200 is the three-ring four-pole male connector belonging to the audio extension cable 600. When the second detection value DET2 is lower than the threshold TH3, it is determined that the audio plug 200 is the two-ring three-pole male connector belonging to the cable of the loudspeaker device 400, and when the second detection value DET2 is lower than the threshold TH2 but higher than the threshold TH3, it is determined that the audio plug 200 is the three-ring four-pole male connector belonging to the cable of the sound picking-up and loudspeaker combination device 500.

In one embodiment, the state detection device 100 further includes an insertion detection circuit 140 and a voltage divider 150. In one embodiment, the insertion detection circuit 140 of the state detection device 100 detects whether a conductor enters the audio jack socket 300. Only when the detection result of the insertion detection circuit 140 indicates that the conductor enters the audio jack socket 300, the first voltage detection circuit 110 and the second voltage detection circuit 120 can be activated. After detecting that the conductor enters the audio jack socket 300, the first voltage detection circuit 110 is activated. According to the first detection value DET1 provided by the first voltage detection circuit 110, the state determination circuit 130 determines the conductor entering the audio jack socket 300 is either the audio plug 200 or water. Furthermore, only when it is determined that the conductor entering the audio jack socket 300 is the audio plug 200, the second voltage detection circuit 200 will be activated. According to the second detection value DET2 provided by the second voltage detection circuit 120, the connector type can be determined. It is note that, in some embodiments, the insertion detection circuit 140 may be omitted, and the insertion detection is performed directly based on the first detection value DET1 outputted by the first voltage detection circuit 110.

Furthermore, the voltage divider 150 includes resistors Rc1, Ra1, and Ra2. The purpose of the resistor Rc1 is to adjust a voltage division provided to the first voltage detection circuit 110, such that the first voltage detection circuit 110 can better detect across the voltage between the contact 311 and the contact 315, where the resistor Ra3 coupled to the voltage VDD2 has same purpose. Furthermore, the purpose of the resistors Ra1 and Ra2 are used to prevent audio signals outputted from the audio interface 10 from interfering with the insertion detection circuit 140 and causing it to malfunction.

After the state detection circuit 100 generates the detection result, the audio interface 10 can correctly control the connected audio equipment, such as: sending a correct corresponding signal to the audio equipment via the contacts, starting or interrupting audio playback, switching audio playback device (such as switching from built-in speakers to external audio equipment), or notifying the electronic device of ingress of water.

Figure 5:
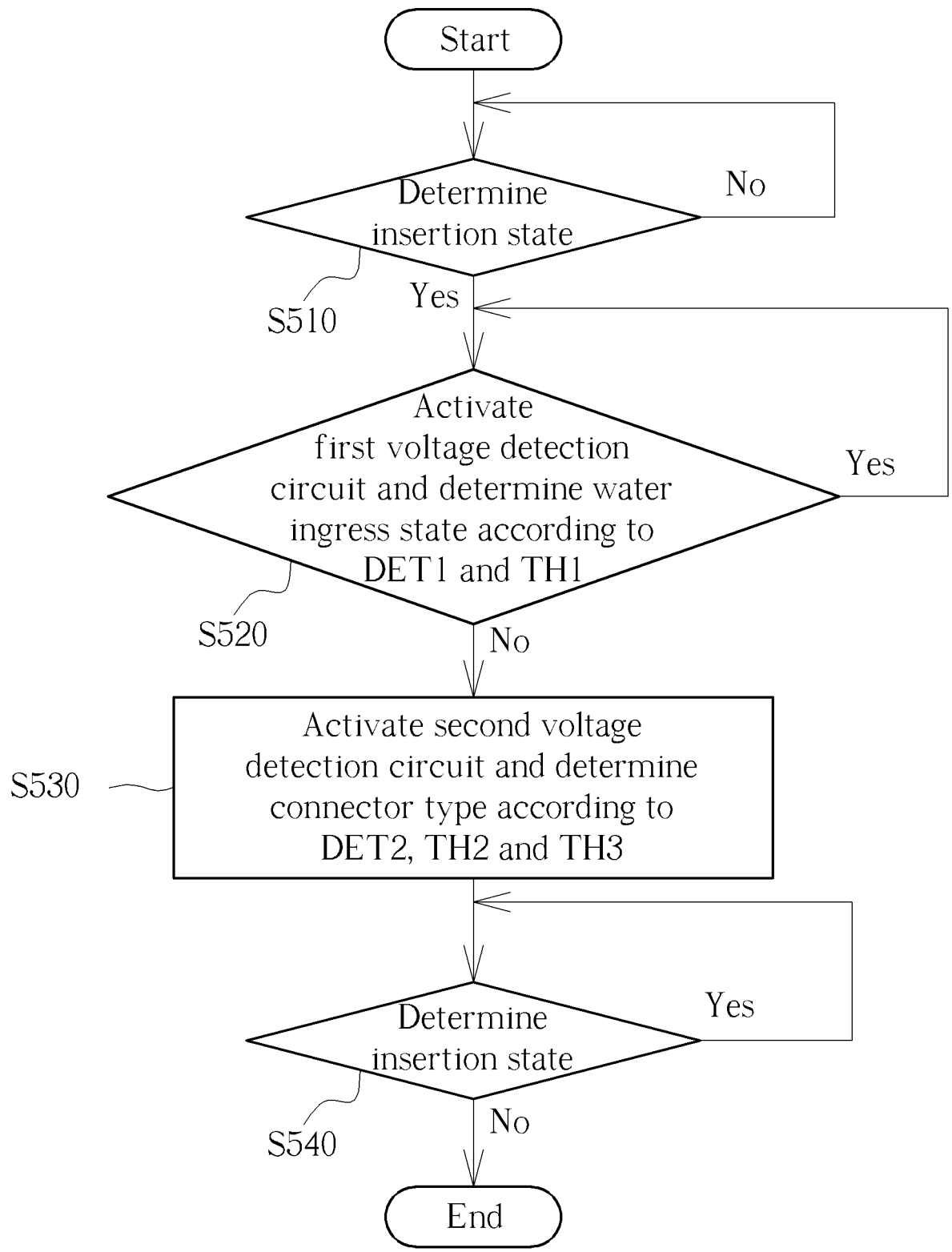
FIG. 5 illustrates a flow chart of state detection according to one embodiment of the present invention.

FIG. 5 illustrates a flow chart of state detection performed by the state detection device 100 according to one embodiment of the present invention. First, at step S510, the insertion detection circuit 140 is utilized to determine whether a conductor enters the audio jack socket 300; if the determination result shows yes, the flow goes to step S520; if the determination result shows not, the flow stops at step S510, which keeps determining whether a conductor enters the audio jack socket 300. At step S520, the first voltage detection circuit 110 is activated. At this time, according to the first detection value DET1 sampled by the first voltage detection circuit 110 (i.e., the voltage across the contact 311 and the contact 315 of the audio jack socket 300) and the first threshold TH1, it is determined whether ingress of water occurs; if the determination result shows yes, the flow stops at step S520, where the first voltage detection circuit 100 remains activated, waiting for the insertion of the audio plug 200. If the determination result of step S520 shows no, the flow goes to step S530, where the first voltage detection circuit 110 is de-activated, and the second voltage detection circuit 120 is activated. According to the second detection value DET2 sampled by the second voltage detection circuit 120 (i.e., the voltage of the contact 311 of the audio jack socket 300 relative to the ground terminal), the second threshold TH2 and the third threshold TH3, it is determined the connector type is: three-ring four-pole male connector belonging to an audio extension cable, two-ring three-pole connector male connector belonging to a cable of the loudspeaker device 400, or three-ring four-pole male connector belonging to a cable of the sound picking-up and loudspeaker combination device 500. Once it is determined that the connector type is the three-ring four-pole male connector belonging to the audio extension cable, the second voltage detection circuit 120 can remain activated to detect. The second voltage detection circuit 120 can end detecting until the connector type is determined as the two-ring three-pole male connector belonging to the cable of the loudspeaker device 400, or until the connector type is determined as the three-ring four-pole male connector belonging to the cable of the sound picking-up and loudspeaker combination device 500. Once the detection ends, the flow goes to step S540, where the insertion detection circuit 140 monitors the insertion state to detect whether the audio plug 200 is removed from the audio jack socket 300. If it is removed, the flow ends.

In summary, the present invention provides circuits and related methods for detecting a connector type of audio equipment and a water ingress state of the audio jack socket of an audio interface. In the present invention, by detecting a voltage across two contacts (i.e., the contact 311 and the contact 315) of the audio jack socket 300 that are connected the first pole 211 of the audio plug 200, it can be determined that whether ingress of water occurs, or whether the audio plug 200 is inserted into the audio jack socket 300. A feature of the present invention is that water ingress detection can correctly detect whether salt water or fresh water enters the audio jack socket 300, and this is accomplished only via the first voltage detection circuit 110. In addition, the present invention also detects a voltage on the contact (i.e., contact 314) on the audio jack socket 300 that is connected to the fourth pole 214 of the audio plug 200, thereby to determine a connector type of the audio plug and a type of audio equipment to which the audio plug belongs. Since the present invention does not use extra contacts for state detection, it is suitable for existing audio jack sockets, and can provide ability of identifying multiple connector types and detecting the water ingress state of the audio jack socket at the same time.

Embodiments in accordance with the present invention can be implemented as an apparatus, method, or computer program product. Accordingly, the present embodiments may take the form of an entirely hardware embodiment, an entirely software embodiment, or an embodiment combining software and hardware aspects that can all generally be referred to herein as a "module" or "system." Furthermore, the present embodiments may take the form of a computer program product embodied in any tangible medium of expression having computer-usable program code embodied in the medium. In terms of hardware, the present invention can be accomplished by applying any of the following technologies or related combinations: an individual operation logic with logic gates capable of performing logic functions according to data signals, and an application specific integrated circuit (ASIC), a programmable gate array (PGA) or a field programmable gate array (FPGA) with a suitable combinational The flowchart and block diagrams in the flow diagrams illustrate the architecture, functionality, and operation of possible implementations of systems, methods, and computer program products according to various embodiments of the present embodiments. In this regard, each block in the flowchart or block diagrams may represent a module, segment, or portion of code, which comprises one or more executable instructions for implementing the specified logical function(s). It is also noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions. These computer program instructions can be stored in a computer-readable medium that directs a computer or other programmable data processing apparatus to function in a particular manner, such that the instructions stored in the computer-readable medium produce an article of manufacture including instruction means which implement the function/act specified in the flowchart and/or block diagram block or blocks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A state detection device for use in an audio interface, comprising:
    a first voltage detection circuit, coupled to a first contact and a second contact of an audio jack socket, and configured to detect a voltage across the first contact and the second contact to generate a first detection value;
    a second voltage detection circuit, coupled to a third contact of the audio jack socket, and configured to detect a voltage on the third contact to generate a second detection value; and
    a state determination circuit, coupled to the first voltage detection circuit and the second voltage detection circuit, configured to determine a water ingress state of the audio jack socket according to the first detection value, and determine a connector type of an audio plug that is inserted into the audio jack socket according to the second detection value.

2. The state detection device of claim 1, further comprising:
    an insertion detection circuit, coupled to the second contact of the audio jack socket, configured to detect a voltage on the second contact to determine an insertion state; and only when the insertion state indicates a conductor enters the audio jack socket, the first voltage detection circuit and the second voltage detection circuit are activated.

3. The state detection device of claim 2, further comprising:
   a voltage divider, coupled between the second contact, the first voltage detection circuit and the insertion detection circuit, arranged to provide voltage divisions to the first voltage detection circuit and the insertion detection circuit.

4. The state detection device of claim 1, wherein the first voltage detection circuit and the second voltage detection circuit are analog-to-digital converters.

5. The state detection device of claim 1, wherein the state determination circuit determines the water ingress state according to the first detection value and a first threshold; when the first detection value is higher than the first threshold, the state determination circuit determines that ingress of water occurs in the audio jack socket, and when the first detection value is lower than the first threshold, the state determination circuit determines that no ingress of water occurs in the audio jack socket, and determines that the audio plug is inserted into the audio jack socket; and the second voltage detection circuit is activated only when the state determination circuit determines that no ingress of water occurs in the audio jack socket.

6. The state detection device of claim 1, wherein the state determination circuit determines the connector type according to the second detection value, a second threshold, and a third threshold; when the second detection value is higher than the second threshold, the state determination circuit determines that the audio plug is a three-ring four-pole male connector of an audio extension cable; when the second detection value is lower than the second threshold but higher than the third threshold, the state determination circuit determines that the audio plug is a three-ring four-pole male connector belonging to a cable of a sound picking-up and loudspeaker device; and when the second detection value is lower than the third threshold, the state determination circuit determines that the audio plug is a two-ring three-pole male connector belonging to a cable of a loudspeaker device.

7. The state detection device of claim 1, wherein the audio jack socket further comprises a fourth contact and a fifth contact; the first contact and the second contact are configured to connect a first pole of the audio plug when the audio plug is inserted into the audio jack socket; the fourth contact is configured to connect to a second pole of the audio plug when the audio plug is inserted into the audio jack socket; the fifth contact is configured to connect to a third pole of the audio plug when the audio plug is inserted into the jack socket, and the third contact is configured to connect to the third pole or a fourth pole of the audio plug when the audio plug is inserted into the audio jack socket.

8. The state detection device of claim 7, wherein the first pole of the audio plug is configured to transmit a left-channel audio signal of the audio interface, the second pole of the audio plug is configured to transmit a right-channel audio signal of the audio interface, and the third pole or the fourth pole of the audio plug is configured to transmit a microphone signal of the audio interface.

9. A state detection method for use in an audio interface, comprising:
   detecting a voltage across a first contact and a second contact of an audio jack socket to generate a first detection value;
   detecting a voltage on a third contact of the audio jack socket to generate a second detection value; and
   determining a water ingress state of the audio jack socket according to the first detection value, and determine a connector type of an audio plug that is inserted into the audio jack socket according to the second detection value.

10. The state detection method of claim 9, further comprising:
   detecting a voltage on the second contact of the audio jack socket to determine an insertion state; and
   only when the insertion state indicates a conductor enters the audio jack socket, performing detection on the voltage across the first contact and the second contact to generate the first detection value, as well as performing detection on the voltage on the third contact to generate the second detection value.

11. The state detection method of claim 9, wherein the step of determining the water ingress state comprises:
   determining the water ingress state according to the first detection value and a first threshold;
   when the first detection value is higher than the first threshold, determining that ingress of water occurs in the audio jack socket;
   when the first detection value is lower than the first threshold, determining that no ingress of water occurs in the audio jack socket, and determining that the audio plug is inserted into the audio jack socket; and
   only when it is determined that no ingress of water occurs in the audio jack socket, performing detection on the voltage on the third contact to generate the second detection value.

12. The state detection method of claim 9, wherein the step of determining the connector type comprises:
   determining the connector type according to the second detection value, a second threshold, and a third threshold;
   when the second detection value is higher than the second threshold, determining that the audio plug is a three-ring four-pole male connector of an audio extension cable;
   when the second detection value is lower than the second threshold but higher than the third threshold, determining that the audio plug is a three-ring four-pole male connector belonging to a cable of a sound picking-up and loudspeaker device; and
   when the second detection value is lower than the third threshold, determining that the audio plug is a two-ring three-pole male connector belonging to a cable of a loudspeaker device.

13. The state detection method of claim 9, wherein the audio jack socket further comprises a fourth contact and a fifth contact; the first contact and the second contact are configured to connect a first pole of the audio plug when the audio plug is inserted into the audio jack socket; the fourth contact is configured to connect to a second pole of the audio plug when the audio plug is inserted into the audio jack socket; the fifth contact is configured to connect to a third pole of the audio plug when the audio plug is inserted into the jack socket, and the third contact is configured to connect to the third pole or a fourth pole of the audio plug when the audio plug is inserted into the audio jack socket.

14. The state detection method of claim 9, wherein the first pole of the audio plug is configured to transmit a left-channel audio signal of the audio interface, the second pole of the audio plug is configured to transmit a right-channel audio signal of the audio interface, and the third pole or the fourth pole of the audio plug is configured to transmit a microphone signal of the audio interface.

* * * * *